United States Patent
Tsai et al.

(10) Patent No.: US 10,224,909 B1
(45) Date of Patent: Mar. 5, 2019

(54) ERROR ELIMINATION AMPLIFIER AND MOTOR CONTROL CIRCUIT USING THE SAME

(71) Applicant: ANPEC ELECTRONICS CORPORATION, Hsinchu (TW)

(72) Inventors: Ming-Jung Tsai, Changhua County (TW); Kun-Min Chen, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/867,885

(22) Filed: Jan. 11, 2018

(30) Foreign Application Priority Data

Aug. 21, 2017 (TW) .............................. 106128258 A

(51) Int. Cl.
| | |
|---|---|
| H03K 5/003 | (2006.01) |
| H03K 5/24 | (2006.01) |
| H02P 29/00 | (2016.01) |
| G01R 33/07 | (2006.01) |

(52) U.S. Cl.
CPC ............ *H03K 5/003* (2013.01); *H02P 29/00* (2013.01); *H03K 5/24* (2013.01); *G01R 33/07* (2013.01)

(58) Field of Classification Search
CPC ....................... H03K 5/003; H03K 5/24; H03F 2203/45048; H03F 2203/45138; H03F 3/45968; H03F 3/45179; H03F 3/45645; G09G 2310/0291; H02P 29/00
See application file for complete search history.

(56) References Cited

U.S. PATENT DOCUMENTS

| | | | |
|---|---|---|---|
| 2013/0093373 A1* | 4/2013 | Chen .................... | H02H 7/0838 318/400.21 |
| 2015/0130388 A1* | 5/2015 | Fukushima .............. | G02B 7/08 318/632 |
| 2015/0155807 A1* | 6/2015 | Lee ........................ | H02P 7/00 318/490 |
| 2017/0307696 A1* | 10/2017 | Werth ................ | G01R 33/0029 |
| 2018/0203063 A1* | 7/2018 | Guo .................. | G01R 31/31715 |

* cited by examiner

*Primary Examiner* — Thai Dinh
(74) *Attorney, Agent, or Firm* — Li & Cai Intellectual Property (USA) Office

(57) ABSTRACT

Disclosed are an error elimination amplifier and a motor control circuit using the same. The error elimination amplifier includes an amplification circuit, a switching circuit, a comparison circuit, an output comparator and a calibration circuit. The comparison circuit includes a first comparator and a second comparator. The switching circuit and the first input end of the output comparator are electrically connected to a signal output end of the amplification circuit. A second input end of the output comparator is coupled to a reference voltage. The calibration circuit is electrically connected to the amplification circuit. An offset of the amplifier is eliminated through the amplification circuit, the switching circuit and the calibration circuit.

15 Claims, 6 Drawing Sheets

ERROR ELIMINATION AMPLIFIER AND MOTOR CONTROL CIRCUIT USING THE SAME

BACKGROUND OF THE INVENTION

1. Field of the Invention

The present disclosure relates to an error elimination amplifier and a motor control circuit; in particular, to an error elimination amplifier having a calibration circuit and a motor control circuit using the same.

2. Description of Related Art

In a motor control circuit, Hall sensors are usually used for detecting the phases of rotators. The magnitude of a magnetic field variation detected by an external Hall sensor is mini volts. Thus, the external Hall sensor has better precision than a Hall sensor built in a control chip has. Considering the chip structure, the magnitude of a magnetic field variation detected by a built-in Hall sensor is micron volts. Generally, according to the conversion rate of the built-in Hall sensor (magnetic-field to voltage), the magnetic field (e.g. 1 Gauss) can be converted to the voltage (e.g. several micron volts), and a predetermined threshold is set as a base voltage for determining signals. However, a Hall sensing signal (or the amplifier) often has an offset, and thus after being amplified by an error elimination amplifier, a waveform distortion will occur to the amplified Hall sensing signal. Therefore, it needs an amplifier with error elimination function and even an extra calibration circuit to make the offset of the amplifier becomes zero.

Accordingly, it will be necessary to have an error elimination amplifier that can calibrate the above mentioned waveform distortion and a motor control circuit using the same.

SUMMARY OF THE INVENTION

The present disclosure provides an error elimination amplifier. The error elimination amplifier includes an amplification circuit, a switching circuit, a comparison circuit, an output comparator and a calibration circuit. The amplification circuit includes a first signal input end, a second signal input end and a signal output end. The first signal input end and the second signal input end respectively receive at least one Hall sensing signal. The switching circuit is electrically connected to the signal output end of the amplification circuit. The comparison circuit includes a first comparator and a second comparator. The first comparator has a first input end, a second input end and an output end, and the first input end of the first comparator is electrically connected to the signal output end of the amplification circuit. The second comparator has a first input end, a second input end and an output end, and the first input end of the second comparator is electrically connected to the signal output end of the amplification circuit. The output comparator has a first input end, a second input end and an output end. The first input end of the output comparator is electrically connected to the signal output end of the amplification circuit, and the second input end of the output comparator is coupled to a reference voltage. The calibration circuit is electrically connected to the amplification circuit. An offset of the Hall sensing signal is eliminated through the amplification circuit, the switching circuit and the calibration circuit. The calibration circuit adjusts a base voltage of the Hall sensing signal based on a predetermined calibration unit to eliminate the offset of the Hall sensing signal.

The present disclosure also provides a motor control circuit. The motor control circuit includes a processing circuit, a speed signal generation circuit, a Hall sensor and an error elimination amplifier. The speed signal generation circuit is electrically connected to the processing circuit. The Hall sensor is electrically connected to the processing circuit, and the Hall sensor detects a variation of an external magnetic field to generate a Hall sensing signal. The error elimination amplifier includes an amplification circuit, a switching circuit, a comparison circuit, an output comparator and a calibration circuit. The amplification circuit includes a first signal input end, a second signal input end and a signal output end. The first signal input end and the second signal input end respectively receive the Hall sensing signal. The switching circuit is electrically connected to the signal output end of the amplification circuit. The comparison circuit includes a first comparator and a second comparator. The first comparator has a first input end, a second input end and an output end, and the first input end of the first comparator is electrically connected to the signal output end of the amplification circuit. The second comparator has a first input end, a second input end and an output end, and the first input end of the second comparator is electrically connected to the signal output end of the amplification circuit. The output comparator has a first input end, a second input end and an output end. The first input end of the output comparator is electrically connected to the signal output end of the amplification circuit, and the second input end of the output comparator is coupled to a reference voltage. The calibration circuit is electrically connected to the amplification circuit. An offset of the Hall sensing signal is eliminated through the amplification circuit, the switching circuit and the calibration circuit. The calibration circuit adjusts a base voltage of the Hall sensing signal based on a predetermined calibration unit to eliminate the offset of the Hall sensing signal.

To sum up, in the error elimination amplifier and the motor control circuit provided by the present disclosure, an offset of the Hall sensor (or the amplifier) is eliminated by an amplification circuit. Specifically, the offset of the Hall sensor amplifier is gradually eliminated by an extra calibration circuit and then becomes zero. As a result, the Hall sensing signal will have no distortion, because the offset of the Hall sensor has been entirely eliminated.

For further understanding of the present disclosure, reference is made to the following detailed description illustrating the embodiments of the present disclosure. The description is only for illustrating the present disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF EXEMPLARY EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings. In these drawings, like references indicate similar elements.

It will be understood that, although the terms first, second, third, and the like, may be used herein to describe various elements, these elements should not be limited by these terms. These terms are only to distinguish one element from another element, and the first element discussed below could be termed a second element without departing from the teachings of the instant disclosure. As used herein, the term "and/or" includes any and all combinations of one or more of the associated listed items.

There are several embodiments described as follows for illustrating but not for restricting the error elimination amplifier and the motor control circuit provided by the present disclosure.

[One Embodiment of the Error Elimination Amplifier]

Figure 1:
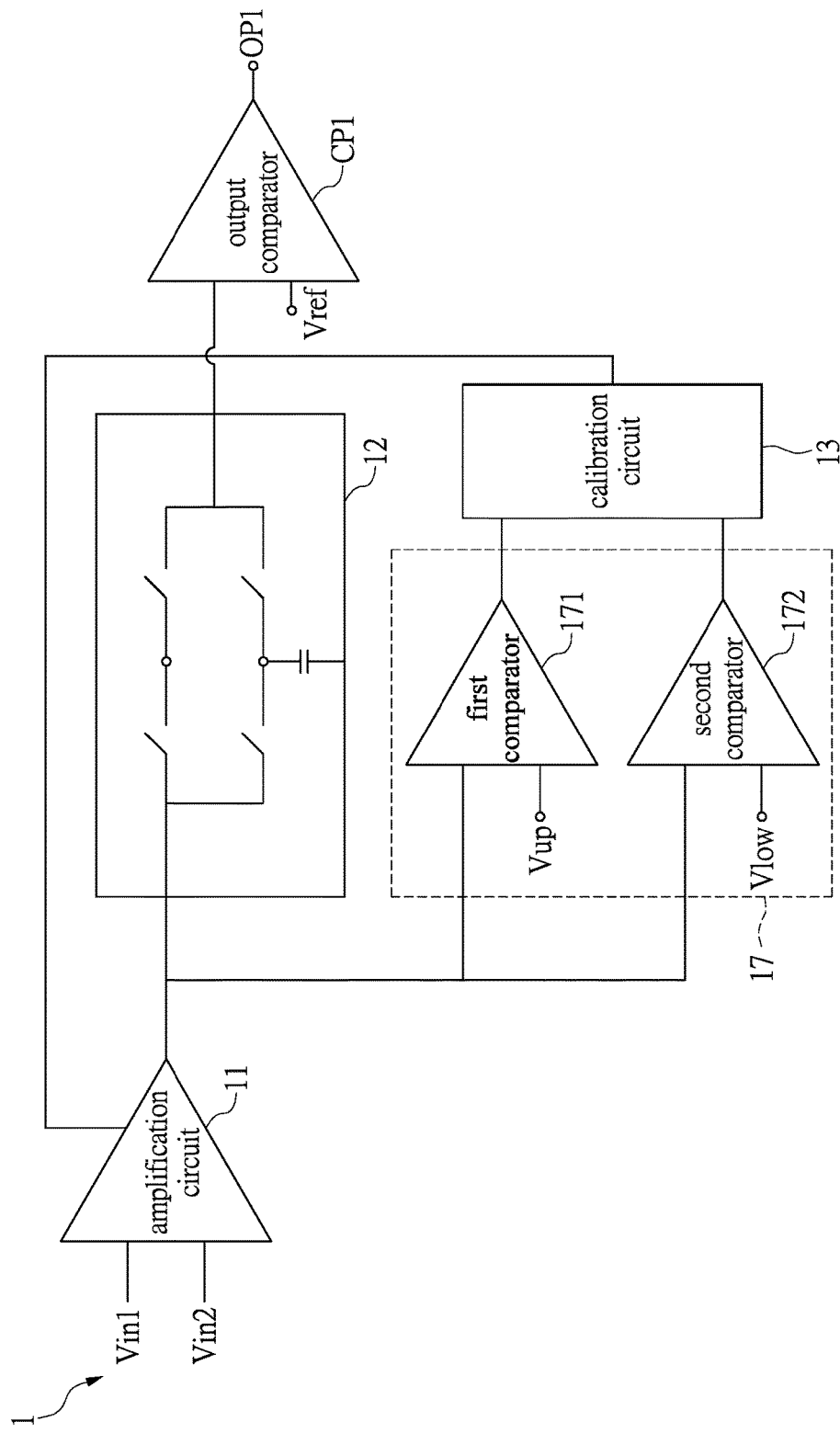
FIG. 1 shows a schematic diagram of an error elimination amplifier according to one embodiment of the present disclosure.
Figure 2:
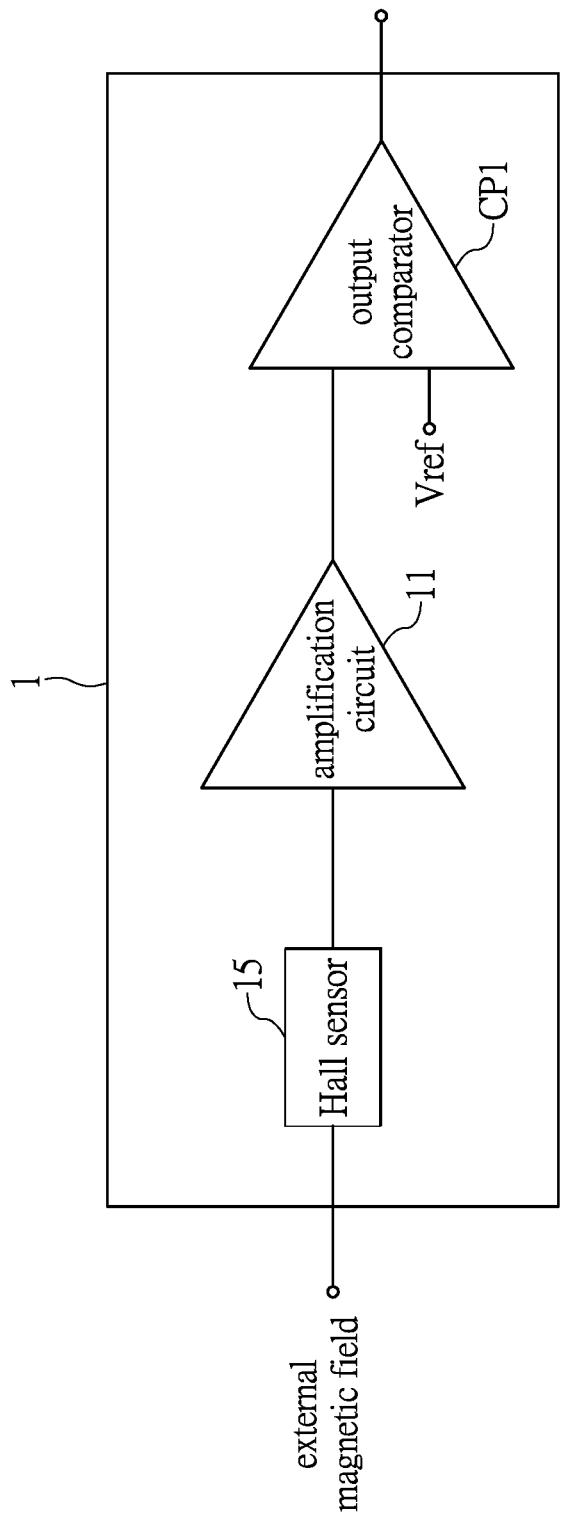
FIG. 2 shows another schematic diagram of an error elimination amplifier according to one embodiment of the present disclosure.

FIG. 1 shows a schematic diagram of an error elimination amplifier according to one embodiment of the present disclosure, and FIG. 2 shows another schematic diagram of an error elimination amplifier according to one embodiment of the present disclosure.

In this embodiment, the error elimination amplifier 1 includes an amplification circuit 11, a switching circuit 12, a calibration circuit 13, a comparison circuit 17 and an output comparator CP1.

The amplification circuit 11 includes a first signal input end Vin1, a second signal input end Vin2 and a signal output end (not shown). The signal output end of the amplification circuit 11 is electrically connected to the switching circuit 12 and the comparison circuit 17. The comparison circuit 17 is electrically connected to the calibration circuit 13. The calibration circuit 13 is electrically connected to the amplification circuit 11. The calibration circuit 13 calibrates the amplification circuit 11 according to a comparison result generated by the comparison circuit 17. The switching circuit 12 is electrically connected to the output comparator CP1. A comparison result between the calibrated Hall sensing signal and reference is outputted from the output end OP of the output comparator CP1.

The comparison circuit 17 includes a first comparator 171 and a second comparator 172. The first comparator 171 and the second comparator 172 respectively have a first input end, a second input end and an output end (not shown). The first input end of the first comparator 171 and the first input end of the second comparator 172 are electrically connected to the signal output end of the amplification circuit 11. The second input end of the first comparator 171 is coupled to an upper-limit voltage Vup, and the second input end of the second comparator 172 is coupled to a lower-limit voltage Vlow.

In addition, the error elimination amplifier 1 further includes a Hall sensor 15, and the Hall sensor 15 is configured to detect a variation of an external magnetic field.

The error elimination amplifier 1 is configured in an integrated circuit chip (IC chip). Thus, the signal magnitude of the magnetic field detected by the Hall sensor 15 is micron volts. Then, the magnitude of the Hall sensing signal turns to be mini volts after being amplified by the amplification circuit 11.

Figure 3:
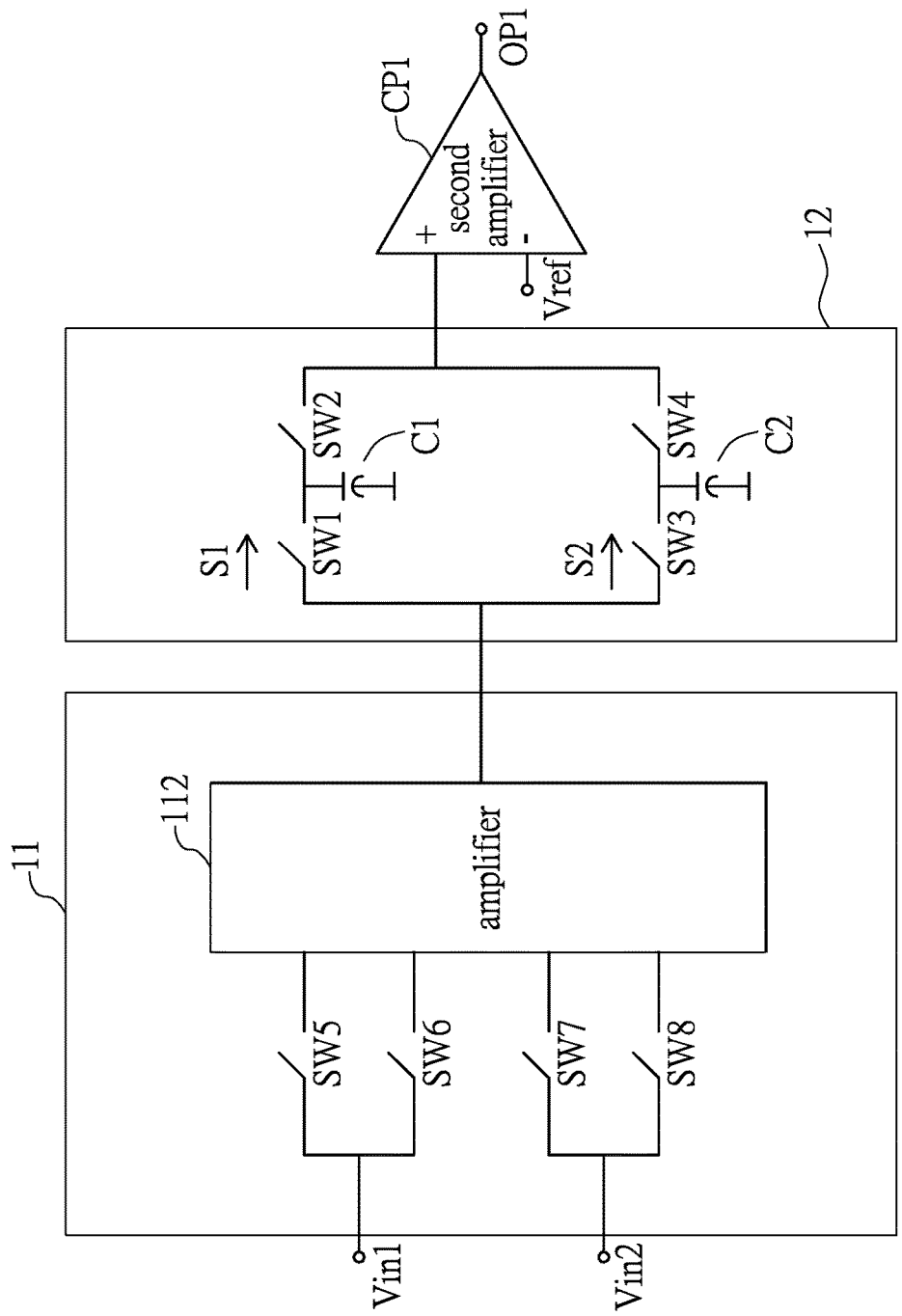
FIG. 3 shows a schematic diagram of part of an error elimination amplifier according to one embodiment of the present disclosure.

Referring to FIG. 3, a schematic diagram of part of an error elimination amplifier according to one embodiment of the present disclosure is shown.

In this embodiment, the switching circuit 12 includes a first switch SW1, a second switch SW2, a third switch SW3, a fourth switch SW4, a first capacitor C1 and a second capacitor C2. The first end of the first switch SW1 is electrically connected to the first end of the third switch SW3. The second end of the first switch SW2 is electrically connected to the first end of the first capacitor C1 and the first end of the first switch SW2. The second end of the third switch SW3 is electrically connected to the first end of the second capacitor C2 and the first end of the fourth switch SW4. The second end of the first capacitor C1 and the second end of the second capacitor C2 are both grounded. The second end of the second switch SW2 is electrically connected to the second end of the fourth switch SW4 and the first input end of the output comparator CP1. The second input end of the output comparator CP1 is coupled to a reference voltage Vref.

The amplification circuit 11 includes an amplifier 112, a fifth switch SW5, a sixth switch SW6, a seventh switch SW7 and an eighth switch SW8.

In the amplification circuit 11, the amplifier 112 is electrically connected to the first signal input end Vin1 through a fifth switch SW5 and a sixth switch SW6, and the amplifier 112 is electrically connected to the second signal input end Vin2 through a seventh switch SW7 and an eighth switch SW8.

Figure 4:
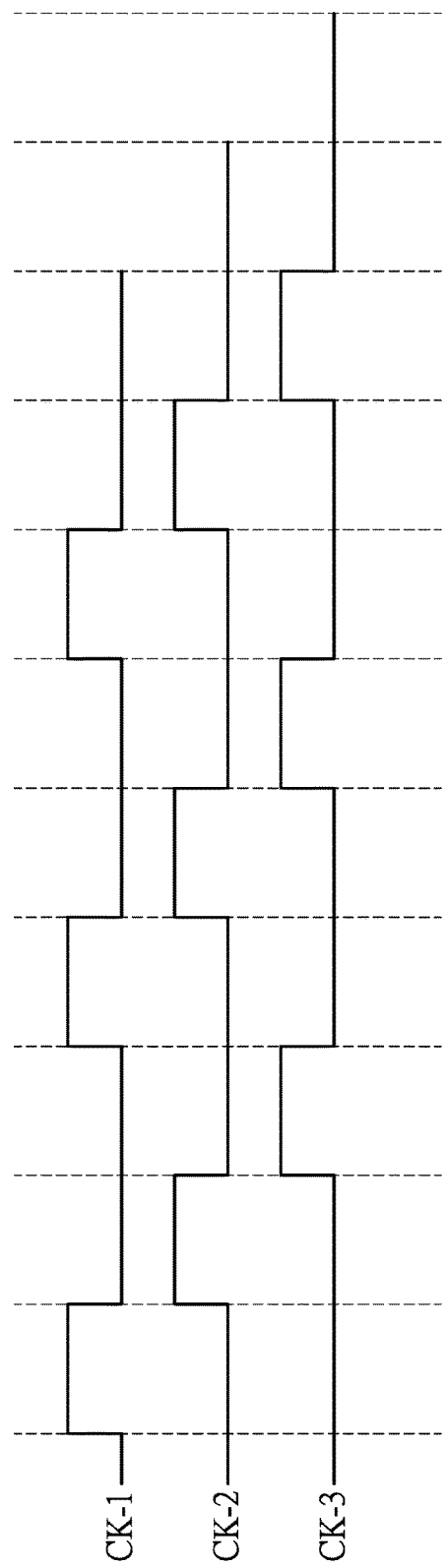
FIG. 4 shows a schematic diagram of clock signals used by an error elimination amplifier according to one embodiment of the present disclosure.

Referring to FIG. 4, a schematic diagram of clock signals used by an error elimination amplifier according to one embodiment of the present disclosure is shown.

In this embodiment, the fifth switch SW5 and the eighth switch SW8 of the amplification circuit 11 are turned on according to the first clock signal CK-1, and a first signal S1 is provided to the first switch SW1.

Then, the sixth switch SW6 and the seventh switch SW7 of the amplification circuit 11 are turned on according to the second clock signal CK-2, and a second signal S2 is provided to the third switch SW3. It should be noted that, the first signal S1 and the second signal S2 include amplified hall-sensor-signals and an offset of the amplifier, and the phase of the offset of the first signal S1 is opposite to the phase of the offset of the second signal S2.

The first signal S1 is temporarily stored in the first capacitor C1, and the second signal S2 is temporarily stored in the second capacitor C2. At this time, the second switch SW2 and the fourth switch SW4 are turned off.

After that, the error elimination amplifier 1 works according to the third clock signal CK-3. When the error elimination amplifier 1 works according to the third clock signal CK-3, the second switch SW2 and the fourth switch SW4 are turned on, and the first switch SW1 and the third switch SW3 are turned off. The first signal S1 and the second signal S2 are simultaneously transmitted to the first input end of the output comparator CP1 to be compared with a reference voltage Vref.

The offset of the amplifier of the first signal S1 and the offset of the amplifier of the second signal S2 have phases reversed to each other, and thus their offsets are mutually cancelled when the first signal S1 and the second signal S2 are simultaneously transmitted to the output comparator CP1. As a result, a Hall sensing signal having no offset can be obtained, and then a comparison result is outputted from the output end OP1 of the output comparator CP1.

In other words, the voltage of the first capacitor C1 and the voltage of the second capacitor C2 include the Hall sensing signals and the offset of the amplifier 112. The voltage contributed by the offset of the amplifier 112 is reversed, but the voltage contributed by the Hall sensing signals is not reversed. Thus, the Hall sensing signals remain and the offset of the amplifier 112 can be removed. In a general condition, wherein the offset of amplifier is not too large, the amplified Hall signal without offset can be obtained by the above process. However, when the offset of amplifier is too large, the amplified waveform distortion will still exist because there is an too large offset of the amplifier 112 and the total signal including the amplified Hall sensing signal and the amplified offset of the amplifier 112 approaches an upper operating limit voltage (e.g. the DC voltage VDD) or a lower operating limit voltage (e.g. the grounding voltage GND). That is, the offset may occupy all headroom of the operating voltage. In this case, no amplified Hall sensing signal can be obtained at first input end of the output comparator CP1.

Therefore, in the error elimination amplifier provided by this embodiment, the offset of the amplifier can be predicted and then most of them will be compensated to avoid the voltages of the amplified hall signal of the first capacitor C1 and the second capacitor C2 being canceled.

Figure 5:
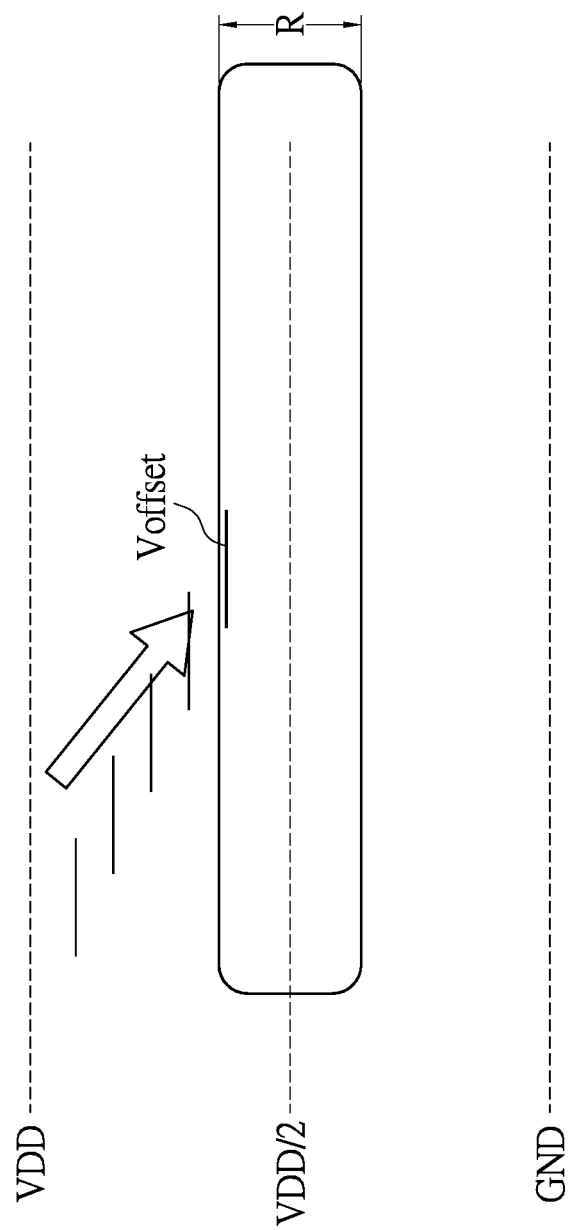
FIG. 5 is a schematic diagram showing how to eliminate an offset of an error elimination amplifier according to one embodiment of the present disclosure.

FIG. 5 is a schematic diagram showing how to eliminate an offset of an error elimination amplifier when offset of amplifier is too large according to one embodiment of the present disclosure.

The amplification circuit 11 is electrically connected to the comparison circuit 17. Specifically, the amplification circuit 11 is electrically connected to the first input end (not shown) of the first comparator 171 and the first input end (not shown) of the second comparator 172. According to this circuit configuration, the offset of the amplifier 112 signal is compared respectively with the upper-limit voltage Vup and the lower-limit voltage Vlow. After that, the comparison circuit 17 generates and transmits a comparison result to the calibration circuit 13.

According to the comparison result, the calibration circuit 13 adjusts the system offset of the error elimination amplifier (i.e. the offset of the amplification circuit 11 and the Hall sensor 15) by adjusting the base voltage Voffset of the amplifier 112. As shown in FIG. 5, due to the adjustment made by the calibration circuit 13, the base voltage Voffset of the error elimination amplifier is gradually lowered to around half of the DC voltage VDD. Then, the adjustment is finished after the base voltage Voffset of the error elimination amplifier is lowered to a voltage within a predetermined voltage range R. Specifically, during the adjustment, the calibration circuit 13 lowers the base voltage Voffset of the error elimination amplifier by a predetermined calibration unit per time. In this embodiment, the base voltage Voffset of the error elimination amplifier can be adjusted to be any voltage from 0 to the DC voltage VDD. Also, the predetermined voltage range R is twice the predetermined calibration unit and is around half of the DC voltage VDD. However, the predetermined calibration unit and the predetermined voltage range R can be freely designed depending on needs. For example, according to practical requirements, the predetermined voltage range R can also be N times of the predetermined calibration unit, wherein "N" is an integer larger than zero.

Figure 6:
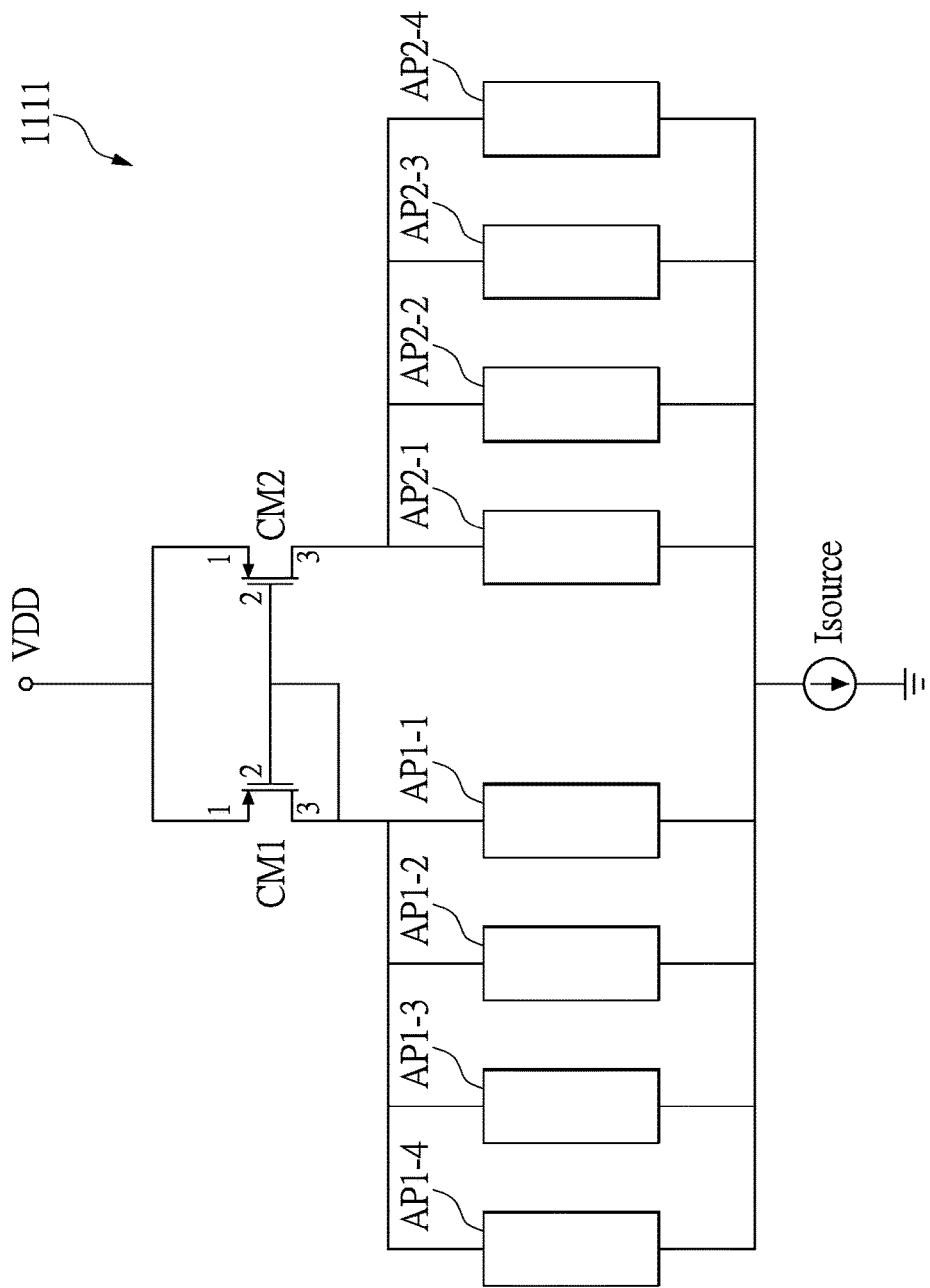
FIG. 6 shows a schematic diagram of part of a gain circuit of a first amplifier in an error elimination amplifier according to one embodiment of the present disclosure.

Referring to FIG. 6, a schematic diagram of part of a gain circuit of a first amplifier in an error elimination amplifier according to one embodiment of the present disclosure is shown. It should be noted that, the gain circuit in this embodiment can be used in the second amplifier or other relevant amplification circuits.

In this embodiment, the gain circuit 1111 includes a first current-mirror device CM1, a second current-mirror device CM2, a first error elimination switch AP1-1, a second error elimination switch AP1-2, a third error elimination switch AP1-3, a fourth error elimination switch AP1-4, a fifth error elimination switch AP2-1, a sixth error elimination switch AP2-2, a seventh error elimination switch AP2-3, an eighth error elimination switch AP2-4, and a current source Isource.

The first end of the first current-mirror device CM1 and the first end of the second current-mirror device CM2 are coupled to the DC voltage VDD. The second end of the first current-mirror device CM1 is electrically connected to the second end of the second current-mirror device CM2 and the third end of the first current-mirror device CM1.

The third end of the first current-mirror device CM1 is electrically connected to the first end of the first error elimination switch AP1-1, the first end of the second error elimination switch AP1-2, the first end of the third error elimination switch AP1-3 and the first end of the fourth error elimination switch AP1-4. The second end of the first error elimination switch AP1-1, the second end of the second error elimination switch AP1-2, the second end of the third error elimination switch AP1-3 and the second end of the fourth error elimination switch AP1-4 are electrically connected to the first end of the current source Isource. In addition, the second end of the current source Isource is grounded.

The third end of the second current-mirror device CM2 is electrically connected to the first end of the fifth error elimination switch AP2-1, the first end of the sixth error elimination switch AP2-2, the first end of the seventh error elimination switch AP2-3, and the first end of the eighth error elimination switch AP2-4. The second end of the fifth error elimination switch AP2-1, the second end of the sixth error elimination switch AP2-2, the second end of the seventh error elimination switch AP2-3, and the second end of the eighth error elimination switch AP2-4 are electrically connected to the first end of the current source Isource.

The first error elimination switch AP1-1, the second error elimination switch AP1-2, the third error elimination switch AP1-3, the fourth error elimination switch AP1-4, the fifth error elimination switch AP2-1, the sixth error elimination switch AP2-2, the seventh error elimination switch AP2-3, and the eighth error elimination switch AP2-4 work independently.

The currents flowing through the first error elimination switch AP1-1, the second error elimination switch AP1-2, the third error elimination switch AP1-3, the fourth error elimination switch AP1-4 have the superposition property, and the currents flowing through the fifth error elimination switch AP2-1, the sixth error elimination switch AP2-2, the seventh error elimination switch AP2-3, and the eighth error elimination switch AP2-4 also have the superposition property. For example, if the switches are MOS devices, when more switches turn on, more transconductance (gm) will be resulted, and then the offset of the amplifier will vary. The operation of all error elimination switches helps to adjust the error of the first amplifier 111, which helps to eliminate the offset of the error elimination amplifier.

[One Embodiment of the Motor Control Circuit]

In this embodiment, the error elimination amplifier 1 provided by the above embodiment is used in the motor control circuit (not shown), such that the motor control circuit can control the rotation speed of a motor according to a variation of the external magnetic field. Details relevant to the error elimination amplifier 1 have been illustrated in the above description, and thus they are not repeated herein.

The motor control circuit includes a processing circuit, a control signal processing circuit, a driving circuit, a speed signal generation circuit and a Hall sensor. The processing circuit is electrically connected to the control signal processing circuit, the driving circuit, the speed signal generation circuit and the Hall sensor. The error elimination amplifier 1 is electrically connected to the Hall sensor. The error elimination amplifier 1 receives a Hall sensing signal from the Hall sensor for eliminating the offset of the Hall sensing signal. Then, the Hall sensing signal having no offset is transmitted to the processing circuit. The processing circuit controls the speed signal generation circuit to generate a speed signal to a motor system according to the Hall sensing signal having no offset.

To sum up, in the error elimination amplifier and the motor control circuit provided by the present disclosure, an offset of the amplifier 112 is eliminated by an amplification circuit. Specifically, the system offset of the error elimination amplifier is gradually eliminated by a calibration circuit and then becomes zero. As a result, the Hall sensing signal will have no distortion, because the offset of the amplifier 112 has been entirely eliminated.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An error elimination amplifier, comprising:
   an amplification circuit, including a first signal input end, a second signal input end and a signal output end, wherein the first signal input end and the second signal input end respectively receive at least one Hall sensing signal;
   a switching circuit, electrically connected to the signal output end of the amplification circuit;
   a comparison circuit, including:
      a first comparator, having a first input end, a second input end and an output end, wherein the first input end of the first comparator is electrically connected to the signal output end of the amplification circuit; and
      a second comparator, having a first input end, a second input end and an output end, wherein the first input end of the second comparator is electrically connected to the signal output end of the amplification circuit;
   an output comparator, having a first input end, a second input end and an output end, wherein the first input end of the output comparator is electrically connected to the signal output end of the amplification circuit, and the second input end of the output comparator is coupled to a reference voltage; and
   a calibration circuit, electrically connected to the amplification circuit;
   wherein an offset of the amplifier is eliminated through the amplification circuit, the switching circuit and the calibration circuit;
   wherein the calibration circuit adjusts a base voltage of the error elimination amplifier based on a predetermined calibration unit to eliminate the offset of the Hall sensing signal.

2. The error elimination amplifier according to claim 1, wherein the switching circuit includes:
   a first switch, having a first end and a second end;
   a second switch, having a first end and a second end;
   a third switch, having a first end and a second end;
   a fourth switch, having a first end and a second end;
   a first capacitor, having a first end and a second end; and
   a second capacitor, having a first end and a second end;
   wherein the first end of the first switch and the first end of the third switch are electrically connected to the signal output end of the amplification circuit, the second end of the first switch is electrically connected to the first end of the first capacitor and the first end of the second switch, the second end of the first capacitor is grounded, the second end of the third switch is electrically connected to the first end of the second capacitor and the first end of the fourth switch, the second end of the second capacitor is grounded, and the second end of the second switch and the second end of the fourth switch are electrically connected to the first input end of the output comparator.

3. The error elimination amplifier according to claim 1, wherein the amplification circuit has an amplifier, the amplifier is electrically connected to the first signal input end through a fifth switch and a sixth switch, and the amplifier is electrically connected to the second signal input end through a seventh switch and an eighth switch.

4. The error elimination amplifier according to claim 1, further comprising:
   a Hall sensor, detecting a variation of an external magnetic field.

5. The error elimination amplifier according to claim 1, wherein the calibration circuit adjusts the base voltage of the Hall sensing signal until the base voltage of the Hall sensing signal is within a predetermined voltage range.

6. The error elimination amplifier according to claim 1, wherein the predetermined voltage range is twice the predetermined calibration unit.

7. The error elimination amplifier according to claim 1, wherein the predetermined voltage range is several times of the predetermined calibration unit.

8. The error elimination amplifier according to claim 1, wherein the amplification circuit works according to at least two clock signals.

9. A motor control circuit, comprising:
   a processing circuit;
   a speed signal generation circuit, electrically connected to the processing circuit;
   a Hall sensor, electrically connected to the processing circuit, detecting a variation of an external magnetic field to generate a Hall sensing signal; and
   an error elimination amplifier, including:
      an amplification circuit, including a first signal input end, a second signal input end and a signal output end, wherein the first signal input end and the second signal input end respectively receive the Hall sensing signal;

a switching circuit, electrically connected to the signal output end of the amplification circuit;

a comparison circuit, including:
   a first comparator, having a first input end, a second input end and an output end, wherein the first input end of the first comparator is electrically connected to the signal output end of the amplification circuit; and
   a second comparator, having a first input end, a second input end and an output end, wherein the first input end of the second comparator is electrically connected to the signal output end of the amplification circuit;

an output comparator, having a first input end, a second input end and an output end, wherein the first input end of the output comparator is electrically connected to the signal output end of the amplification circuit, and the second input end of the output comparator is coupled to a reference voltage; and a calibration circuit, electrically connected to the amplification circuit;

wherein an offset of the Hall sensing signal is eliminated through the amplification circuit, the switching circuit and the calibration circuit;

wherein the calibration circuit adjusts a base voltage of the Hall sensing signal based on a predetermined calibration unit to eliminate the offset of the Hall sensing signal.

10. The motor control circuit according to claim 9, wherein the switching circuit includes:
a first switch, having a first end and a second end;
a second switch, having a first end and a second end;
a third switch, having a first end and a second end;
a fourth switch, having a first end and a second end;
a first capacitor, having a first end and a second end; and
a second capacitor, having a first end and a second end;
wherein the first end of the first switch and the first end of the third switch are electrically connected to the signal output end of the amplification circuit, the second end of the first switch is electrically connected to the first end of the first capacitor and the first end of the second switch, the second end of the first capacitor is grounded, the second end of the third switch is electrically connected to the first end of the second capacitor and the first end of the fourth switch, the second end of the second capacitor is grounded, and the second end of the second switch and the second end of the fourth switch are electrically connected to the first input end of the output comparator.

11. The motor control circuit according to claim 9, wherein the amplification circuit has an amplifier, the amplifier is electrically connected to the first signal input end through a fifth switch and a sixth switch, and the amplifier is electrically connected to the second signal input end through a seventh switch and an eighth switch.

12. The motor control circuit according to claim 9, wherein the calibration circuit adjusts the base voltage of the Hall sensing signal until the base voltage of the Hall sensing signal is within a predetermined voltage range.

13. The motor control circuit according to claim 9, wherein the predetermined voltage range is twice the predetermined calibration unit.

14. The motor control circuit according to claim 9, wherein the predetermined voltage range is several times of the predetermined calibration unit.

15. The motor control circuit according to claim 9, wherein the amplification circuit works according to at least two clock signals.

* * * * *